(12) United States Patent
Kwon et al.

(10) Patent No.: US 8,154,019 B2
(45) Date of Patent: Apr. 10, 2012

(54) SEMICONDUCTOR APPARATUS AND CALIBRATION METHOD THEREOF

(75) Inventors: Yong Kee Kwon, Ichon-si (KR); Hyung Dong Lee, Ichon-si (KR); Young Park Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 287 days.

(21) Appl. No.: 12/649,193

(22) Filed: Dec. 29, 2009

(65) Prior Publication Data

US 2011/0074369 A1    Mar. 31, 2011

(30) Foreign Application Priority Data

Sep. 30, 2009   (KR) .................. 10-2009-0093574

(51) Int. Cl.
    *H01L 23/58*    (2006.01)
(52) U.S. Cl. .............. 257/48; 255/E23.002; 438/14; 323/265
(58) Field of Classification Search .............. 257/48, 257/E23.002, 777, 734, 782, 685, 686, 723, 257/E25.005, E25.006, E25.018, E25.021, 257/E25.027, E23.085, 698, 737; 324/601, 324/76.11; 323/265; 438/18, 109, 14, 17; 702/64, 85, 108, 109
See application file for complete search history.

(56) References Cited

U.S. PATENT DOCUMENTS

| | | | |
|---|---|---|---|
| 7,317,256 B2 | 1/2008 | Williams et al. | |
| 7,598,523 B2 | 10/2009 | Luo et al. | |
| 7,869,240 B2 * | 1/2011 | Shimizu et al. | ........ 365/51 |
| 2008/0315388 A1 | 12/2008 | Periaman et al. | |
| 2009/0020865 A1 | 1/2009 | Su | |
| 2009/0134500 A1 | 5/2009 | Kuo | |
| 2009/0166873 A1 | 7/2009 | Yang et al. | |

FOREIGN PATENT DOCUMENTS

| KR | 10-20090048084 A | 5/2009 |
|---|---|---|
| KR | 10-20090100022 A | 9/2009 |

\* cited by examiner

*Primary Examiner* — Jasmine Clark
(74) *Attorney, Agent, or Firm* — William Park & Associates Ltd.

(57) ABSTRACT

A semiconductor apparatus includes a reference voltage generation unit, a comparison voltage generation unit, and a calibration unit. The reference voltage generation unit is disposed in a reference die and configured to generate a reference voltage. The comparison voltage generation unit is disposed in a die stacked on the reference die and configured to generate a comparison voltage in response to a calibration control signal. The calibration unit is configured to compare a level of the reference voltage with a level of the comparison voltage and generate the calibration control signal.

9 Claims, 3 Drawing Sheets

SEMICONDUCTOR APPARATUS AND CALIBRATION METHOD THEREOF

CROSS-REFERENCE TO RELATED APPLICATION

The present application claims priority under 35 U.S.C. §119(a) to Korean Application No. 10-2009-0093574, filed on Sep. 30, 2009, in the Korean Intellectual Property Office, which is incorporated herein by reference in its entirety as if set forth in full.

BACKGROUND

1. Technical Field

The present invention relates to a semiconductor apparatus, and more particularly, to a semiconductor apparatus and a calibration method thereof.

2. Related Art

Semiconductor apparatuses, specifically memory apparatuses such as a dynamic random access memory (DRAM), are constantly required to be reduced in size and increased in capacity and performance. Accordingly, memory apparatuses are highly integrated and it is necessary to increase the capacity of a unit package to meet this requirement. From this need, technologies have been developed which increase the capacity of semiconductor apparatuses while packaging a plurality of chips into a single package. Furthermore, recent studies have been extensively conducted on three-dimensional (3D) package semiconductor apparatuses using a Through Silicon Via (TSV) technology in which a via passes through a plurality of stacked chips so that they can be electrically connected together.

The plurality of chips contained in a single package operates as a single semiconductor apparatus. Thus, characteristics of the respective chips with respect to process, voltage and temperature (PVT) variations must coincide with one another. However, due to constraints imposed by semiconductor fabrication processes for fabricating a large number of chips on a wafer, the stacked chips constituting a single semiconductor apparatus inevitably have varied characteristics from one another.

SUMMARY

Various embodiments of the invention may provide a semiconductor apparatus and a calibration method thereof in which a plurality of stacked dies may have the substantially same characteristics are described herein.

In one embodiment of the present invention, a semiconductor apparatus with a plurality of stacked dies comprises: a reference voltage generation unit disposed in a reference die and configured to generate a reference voltage; a comparison voltage generation unit disposed in a die stacked on the reference die and configured to generate a comparison voltage in response to a calibration control signal; and a calibration unit configured to compare a level of the reference voltage with a level of the comparison voltage to generate the calibration control signal.

In another embodiment of the present invention, a method for calibrating a semiconductor apparatus with a plurality of stacked dies comprises: selecting any one of the plurality of dies as a reference die, generating a reference voltage from the reference die; comparing a level of the reference voltage with levels of comparison voltages generated from the dies other than the reference die, and calibrating the levels of the comparison voltages to be substantially equal to the level of the reference voltage.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
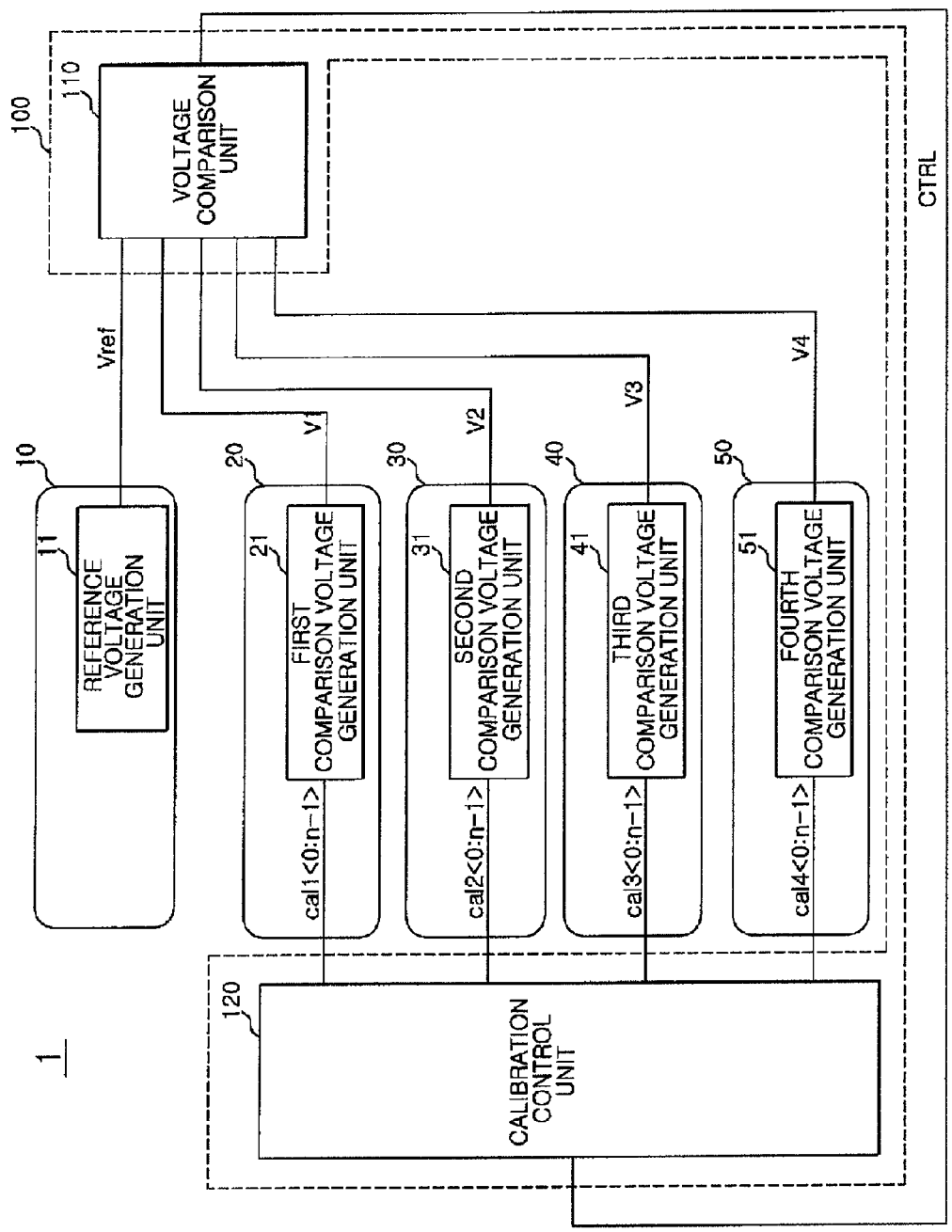
FIG. 1 is a block diagram schematically illustrating a configuration of a semiconductor apparatus according to one embodiment of the invention.

Advantages and characteristics of the present invention and a method for achieving them will be apparent with reference to embodiments described below in addition to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals FIG. 1 is a block diagram schematically illustrating a configuration of a semiconductor apparatus according to one is embodiment of the present invention. In FIG. 1, the semiconductor apparatus 1 comprises a plurality of stacked dies. The plurality of dies may be comprised in a single package. Although the semiconductor apparatus 1 is illustrated with five stacked dies in FIG. 1, the present invention may also be applied to any semiconductor apparatus, regardless of the number of stacked dies.

Referring to FIG. 1, the semiconductor apparatus 1 according to one embodiment comprises a reference die 10, first to fourth stacked dies 20 to 50, and a calibration unit 100. The reference die 10 comprises a reference voltage generation unit 11. The reference die 10 may be an arbitrary die selected among the plurality of dies comprised in the single package. The reference voltage generation unit 11 may be configured using an arbitrary logic circuit provided in the reference die 10. That is, the reference voltage generation unit 11 may be configured using any logic circuit which is capable of generating a reference voltage Vref having a level between an external voltage VDD and a ground voltage VSS, upon operation of the semiconductor apparatus 1.

The first to fourth stacked dies 20 to 50 comprise first to fourth comparison voltage generation units 21, 31, 41 and 51, respectively. In FIG. 1, the first stacked die 20 comprises a first comparison voltage generation unit 21 configured to generate a first comparison voltage V1 in response to a first calibration control signal cal1<0:n−1>, and the second stacked die 30 comprises a second comparison voltage generation unit 31 configured to generate a second comparison voltage V2 in response to a second calibration control signal cal2<0:n−1>. Also, the third stacked die 40 comprises a third comparison voltage generation unit 41 configured to generate a third comparison voltage V3 in response to a third calibration control signal cal3<0:n−1>, and the fourth stacked die 50 comprises a fourth comparison voltage generation unit 51 configured to generate a fourth comparison voltage V4 in response to a fourth calibration control signal cal4<0:n−1>.

The calibration unit 100 compares the level of the reference voltage Vref with the levels of the first to fourth comparison voltages V1 to V4, and performs a calibration operation to make the first to fourth comparison voltages V1 to V4 have the substantially same level as the level of the reference voltage Vref. The calibration unit 100 comprises a voltage comparison unit 110 and a calibration control unit 120. The voltage comparison unit 110 compares the level of the reference voltage Vref with the levels of the first to fourth comparison voltages V1 to V4 to generate a control signal CTRL. The calibration control unit 120 generates the calibration control signals cal1<0:n−1> to cal4<0:n−1> in response to the control signal CTRL. The calibration control signals cal1<0:n−1> to cal4<0:n−1> may be multi-bit code signals. The control signal CTRL may be used to increase or decrease code values of the multi-bit calibration control signals cal1<0:n−1> to cal4<0:n−1>. The voltage comparison unit 110 may be configured with a general comparator circuit which compares the level of the reference voltage Vref with the levels of the is first to fourth comparison voltages V1 to V4 to generate the control signal CTRL. The calibration control unit 120 may be configured with a general counting circuit which increases or decreases the code values of the calibration control signals cal1<0:n−1> to cal4<0:n−1> in response to the control signal CTRL. As described above, the calibration unit 100 may be configured by adopting any conventional logic circuits for calibration operations.

Although the calibration unit 100 is shown to be disposed outside the dies 10 to 50 in FIG. 1, the calibration unit 100 may be disposed inside any one of the reference die 10 and the first to fourth stacked dies 20 to 50. The dies 10 to 50 and the calibration unit 100 may be electrically connected together through a TSV. For example, when the calibration unit 100 is disposed in the reference die 10, the first to fourth comparison voltages V1 to V4 may be transferred to the voltage comparison unit 110 disposed in the reference die 10, and the calibration control signals cal1<0:n−1> to cal4<0:n−1> generated from the calibration control unit 120 may be transferred to the first to fourth comparison voltage generation units 21, 31, 41, and 51 through the TSV, respectively.

As a representative example, the operation of calibrating the first comparison voltage V1 is described below. The voltage comparison unit 110 of the calibration unit 100 compares the level of the reference voltage Vref generated from the reference voltage generation unit 11 with the level of the first comparison voltage V1 generated from the first comparison voltage generation unit 21 of the first stacked die 20. For example, when the level of the reference voltage Vref is higher than the level of the first comparison voltage V1, the voltage comparison unit 110 may generate the control signal CTRL which enables the calibration control unit 120 to decrease the code value of the first calibration control signal cal1<0:n−1>. On the other hand, when the level of the reference voltage Vref is lower than the level of the first comparison voltage V1, the voltage comparison unit 110 may generate the control signal CTRL which enables the calibration control unit 120 to increase the code value of the first calibration control signal cal1<0:n−1>. When the level of the first comparison voltage V1 is substantially equal to the level of the reference voltage Vref, the voltage comparison unit 110 may generate the control signal CTRL which enables the calibration control unit 120 not to change the code values of the first calibration control signals cal1<0:n−1> any more and maintains the determined code values. Therefore, the level of the first comparison voltage V1 is calibrated so that it becomes substantially equal to the level of the reference voltage Vref generated from the reference die 10. After the calibration operation is completed, the first calibration control signal cal1<0:n−1> for generating the first comparison voltage V1 substantially equal to the reference voltage Vref has information on skew between the reference die 10 and the first stacked die 20. Hence, the first calibration control signal cal1<0:n−1> may be used in a logic circuit comprised in the first stacked die 10 which is required to correct the skew with respect to the reference die 10. That is, the is skew between the reference die 10 and the first stacked die 20 may be corrected by the first calibration control signal cal1<0:n−1>.

The second to fourth comparison voltages V2 to V4 generated from the second to fourth stacked dies 30 to 50 may be calibrated to be substantially equal to the reference voltage Vref in the same manner as the case of the first comparison voltage V1. The above-described calibration operation is merely exemplary, and may be changed according to an adopted calibration scheme.

Figure 2:
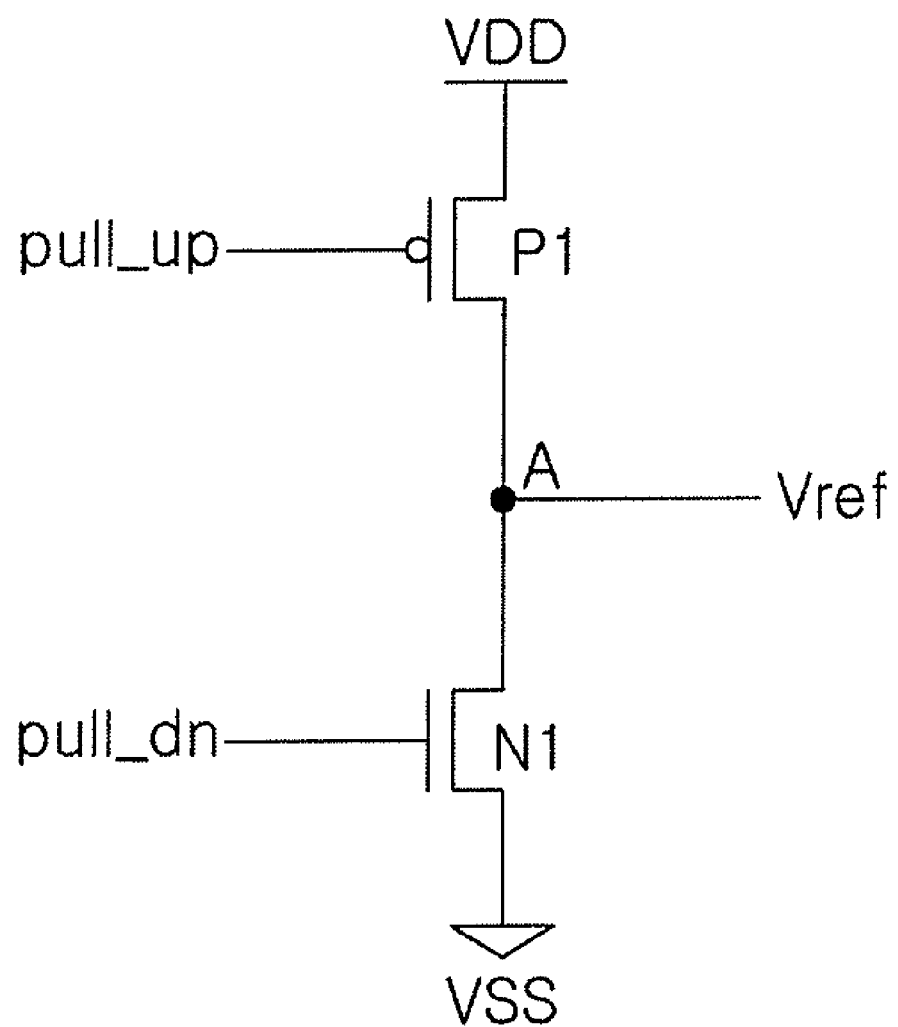
FIG. 2 is a circuit diagram illustrating an example of a reference voltage generation unit of FIG. 1 of the invention.

FIG. 2 is a circuit diagram illustrating an example of the reference voltage generation unit 11 of FIG. 1. Referring to FIG. 2, the reference voltage generation unit 11 may be configured with an inverter which comprises a first p-type metal oxide semiconductor (PMOS) transistor P1 and an n-type metal oxide semiconductor (NMOS) transistor N1. As described above, the inverter comprising the reference voltage generation unit 11 is merely exemplary, and the reference voltage generation unit 11 may be configured using any logic circuit provided in the reference die 10. The first PMOS transistor P1 has a gate receiving a pull-up signal pull_up, a source connected to an external voltage (VDD) terminal, and a drain connected to a first node A. The first NMOS transistor N1 has a gate receiving a pull-down signal pull-dn, a source connected to a ground voltage (VSS) terminal, and a drain connected to the first node A. Therefore, the reference voltage generation unit 11 may generate the reference voltage Vref through the first node A, depending on the sizes of the first PMOS transistor P1 and the first NMOS transistor N1 and the voltage levels of the pull-up signal pull_up and the pull-down signal pull_dn. Thus, the reference voltage Vref has a level between the external voltage VDD and the ground voltage VSS, and is an arbitrary voltage which may be varied depending on types of the logic circuit used as the reference voltage generation unit 11. The pull-up signal pull_up and the pull-down signal pull_dn may be defined as general input signals of the logic circuit used as the reference voltage generation unit 11.

Figure 3:
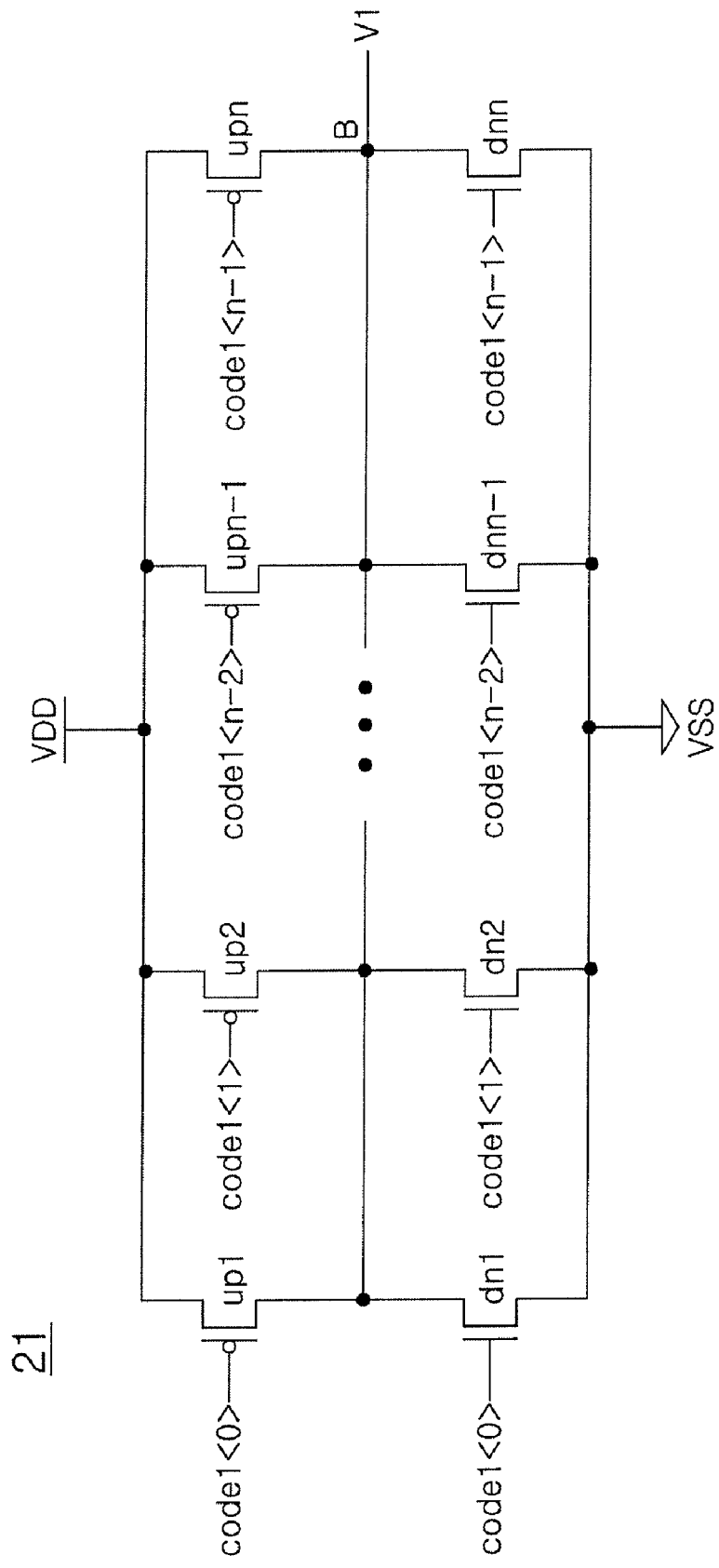
FIG. 3 is a circuit diagram illustrating an example of a first comparison voltage generation unit of FIG. 1 according to one embodiment of the invention.

FIG. 3 is a circuit diagram illustrating an example of the first comparison voltage generation unit 21 of FIG. 1 according to comparison voltage generation unit 21 may comprise a plurality of pull-up transistors up1 to upn and a plurality of pull-down transistors dn1 to dnn configured to receive the first calibration control signal cal1<0:n−1>. The pull-up transistors up1 to upn and the pull-down transistors dn1 to dnn are connected in series to constitute a plurality of legs connected in parallel. The first pull-up transistor up1 and the first pull-down transistor dn1 may receive the first bit cal1<0> of the first calibration control signal cal1<0:n−1>, and the nth pull-up transistor upn and the nth pull-down transistor dnn may receive the nth bit of the first calibration control signal cal1<0:n−1>. Therefore, the pull-up transistors up1 to upn may apply the external voltage VDD to a second node B according to the bit logic values of the first calibration control signals cal1<0:n−1>, and the pull-down transistors dn1 to dnn may apply the ground voltage VSS to the second node B is according to the bit logic values of the first calibration control signal cal1<0:n−1>. In such a configuration, the first comparison voltage generation unit 21 may generate the first comparison voltage V1, whose voltage level is varied according to the first calibration control signal cal1<0:n−1>, through the second node B.

The second to fourth comparison voltage generation units 31, 41 and 51 have the same configuration as the first comparison voltage generation unit 21. However the difference from the first comparison voltage generation unit 21 is that the second to fourth calibration control signals cal2<0:n−1> to cal4<0:n−1> are applied to the second to fourth comparison voltage generation unit 31, 41 and 51, respectively.

The first to fourth comparison voltage generation units 21, 31, 41 and 51 are disposed in certain regions inside the first to fourth stacked dies 20, 30, 40 and 50 where the first to fourth comparison voltage generation units 21, 31, 41 and 51 are comprised, respectively, while corresponding to the region where the reference voltage generation unit 11 is disposed inside the reference die 10. Since the semiconductor apparatus 1 according to the embodiment is configured to reduce the skew and variation between the plurality of stacked dies comprised in the single package, the correction of the skew and variation between the circuits provided in the regions corresponding to the respective stacked dies is the most efficient method that can correct the skew and variation between the stacked dies.

In the semiconductor apparatus 1 according to one embodiment, the reference die 10 is selected among the stacked dies 10 to 50, and the level of the reference voltage Vref generated from the logic circuit disposed inside the reference die 10, that is, the reference voltage generation unit 11, is compared with the levels of the comparison voltages V1 to V4 generated from the comparison voltage generation units 21, 31, 41 and 51 disposed in the dies 20 to 50 other than the reference die 10. The calibration operation is repeated until the levels of the comparison voltages V1 to V4 become substantially equal to the level of the reference voltage Vref. The calibration operation is stopped when the levels of the comparison voltages V1 to V4 become substantially equal to the level of the reference voltage Vref through the calibration operation. The calibration control signals cal1<0:n−1> to cal4<0:n−1> obtained through the calibration operation may be used in any logic circuits provided in the stacked dies 20 to 50 which require the calibration operation.

Therefore, the skew between the stacked dies may be corrected using the calibration results. That is, the respective stacked dies may have the substantially same characteristics. Consequently, normal operation between the respective dies is possible, and the increased operation speed and improved operation performance of the semiconductor apparatus may be ensured.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor apparatus with a plurality of stacked dies, comprising:
    a reference voltage generation unit disposed in a reference die and configured to generate a reference voltage;
    a comparison voltage generation unit disposed in a die stacked on the reference die and configured to generate a comparison voltage in response to a calibration control signal; and
    a calibration unit configured to compare a level of the reference voltage with a level of the comparison voltage and generate the calibration control signal.

2. The semiconductor apparatus according to claim 1, wherein the comparison voltage generation unit is disposed in a region inside the stacked die, which corresponds to a region of the reference die where the reference voltage generation unit is disposed.

3. The semiconductor apparatus according to claim 1, wherein the calibration unit is disposed in one of the reference die and the stacked die.

4. The semiconductor apparatus according to claim 3, wherein the reference die, the stacked die, and the calibration unit are electrically connected together through a Through Silicon Via (TSV).

5. The semiconductor apparatus according to claim 1, wherein the comparison voltage generation unit comprises a plurality of drivers configured to change the level of the comparison voltage in response to the calibration control signal.

6. The semiconductor apparatus according to claim 1, wherein the calibration unit comprises:
    a voltage comparison unit configured to compare the level of the reference voltage with the level of the comparison voltage to generate a control signal; and
    a calibration control unit configured to generate the calibration control signal in response to the control signal.

7. A method for calibrating a semiconductor apparatus with a plurality of stacked dies, the method comprising:
    selecting any one of the plurality of stacked dies as a reference die, and generating a reference voltage from the reference die; and
    comparing a level of the reference voltage with levels of comparison voltages generated from the dies other than the reference die, and calibrating the levels of the comparison voltages to be substantially equal to the level of the reference voltage.

8. The method according to claim 7, wherein regions inside the dies which generate the comparison voltages correspond to a region inside the reference die which generates the reference voltage.

9. The method according to claim 7, wherein the calibrating of the levels of the comparison voltages comprises:
    comparing the level of the reference voltage with the levels of the comparison voltages to generate a control signal; and
    generating a calibration control signal, whose code values are varied in response to the control signal, and changing the levels of the comparison voltages.

* * * * *